United States Patent
Xu et al.

(10) Patent No.: US 8,130,189 B2
(45) Date of Patent: Mar. 6, 2012

(54) GATE DRIVING DEVICE FOR LIQUID CRYSTAL DISPLAY

(75) Inventors: Yubo Xu, Beijing (CN); Bongyeol Ryu, Beijing (CN); Ke Liang, Beijing (CN); Liang Yan, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 958 days.

(21) Appl. No.: 12/125,202

(22) Filed: May 22, 2008

(65) Prior Publication Data

US 2009/0058781 A1 Mar. 5, 2009

(30) Foreign Application Priority Data

Aug. 31, 2007 (CN) .......................... 2007 1 0121213

(51) Int. Cl.
*G09G 3/36* (2006.01)
(52) U.S. Cl. .............. 345/92; 345/100; 345/87; 345/98; 345/204; 377/64; 377/81
(58) Field of Classification Search .................... 345/87, 345/98, 100, 204; 377/64–81
See application file for complete search history.

(56) References Cited

U.S. PATENT DOCUMENTS

| | | | | |
|---|---|---|---|---|
| 6,747,627 B1 * | 6/2004 | Koyama et al. | ............... | 345/100 |
| 2002/0047826 A1 * | 4/2002 | Akimoto et al. | ............... | 345/100 |

FOREIGN PATENT DOCUMENTS

CN 1873829 A 12/2006

* cited by examiner

*Primary Examiner* — Richard Hjerpe
*Assistant Examiner* — Jeffrey Steinberg
(74) *Attorney, Agent, or Firm* — Ladas & Parry LLP

(57) ABSTRACT

The invention relates to a gate driving device for Thin Film Transistor liquid crystal display comprising: a plurality of shift registers directly deposited on an array substrate, said shift registers being composed of effect transistors and a capacitor, obtaining a gate driving signal voltage by controlling an input signal. Said shift register can be realized by 5-layer mask process or 4-layer mask process, by arranging the field effect transistors on the margin part outside the active region on the substrate or at the edge of the substrate, and then directly depositing them on an array substrate. The invention obtains a gate driving signal voltage by the shift registers directly deposited on the substrate, thus overcoming the shortage of the need of driving chips and film layers in the prior art, substantially reducing the production cost for LCD.

6 Claims, 5 Drawing Sheets

GATE DRIVING DEVICE FOR LIQUID CRYSTAL DISPLAY

FIELD OF THE INVENTION

The invention relates to substrate array peripheral design and driving circuit design for liquid crystal display (LCD), and particularly to a Thin Film Transistor (TFT) gate driving device for the LCD.

DESCRIPTION OF THE PRIOR ART

For a TFT LCD, when a positive voltage is applied to a gate of the TFT, the TFT is turned ON; when a negative voltage is applied to the gate of the TFT, the TFT is turned OFF. Writing and maintaining of the pixel voltage on the LCD can be controlled, by controlling the ON and OFF of the TFT with a gate driving signal voltage. At present, TFT LCD obtains the gate driving signal by approach of directly mounting a gate driving Integrated Circuit (IC) on a flexible PCB (Chip on Film), or directly mounting a gate driving IC on a glass (Chip on Glass). The two approaches need to use a driving chip and a film layer, leading to increase in cost of the module and complexity of the module assembly process, prone to the worse binding in the module assembly process, which will inevitably affect the yield of production and the quality of picture.

SUMMARY OF THE INVENTION

An object of the invention is to provide a device for driving the gate of TFT without a driving chip.

In order to achieve the above object, the invention provides a gate driving device for Thin Film Transistor liquid crystal display, comprising: a plurality of sequentially connected shift registers, directly deposited on an array substrate; each of said shift registers including: first, second, third, and fourth field effect transistors, a capacitor, and an ON voltage timing signal input terminal, a clock signal input terminal and a low voltage input terminal; the ON voltage timing signal input terminal being connected with a drain of the first field effect transistor, a gate of the first field effect transistor being connected with a drain of the first field effect transistor, the clock signal input terminal being connected with a drain of the third field effect transistor, the capacitor being connected between a source and a gate of the third field effect transistor, a drain and a source of the fourth field effect transistor being connected with the source of the third field effect transistor and the low voltage input terminal, respectively; a source and a drain of the second field effect transistor being connected with the source of the first field effect transistor and the low voltage input terminal, respectively; a output terminal of each of said shift registers except for a first shift register and a last shift register being connected with a gate of the fourth field effect transistor of a previous shift register and the ON voltage timing signal input terminal of a next shift register; a output terminal of the last shift register being connected with a gate of the fourth field effect transistor of a previous shift register and a gate of the second field effect transistor of said last shift register, a output terminal of the first shift register being connected with the ON voltage timing signal input terminal of a next shift register; the clock signal input terminal of the shift registers with odd sequence numbers inputting a clock signal, the clock signal input terminal of the shift registers with even sequence numbers inputting a clock inverted signal.

Each of said shift registers except for the last shift register further includes: a fifth field effect transistor; a gate of said fifth field effect transistor being connected with the gate of the fourth field effect transistor and the output terminal of the next shift register, a source and a drain of said fifth field effect transistor being connected with the gate of the third field effect transistor and the low voltage input terminal, respectively, a gate of the fifth field effect transistor of the last shift register being connected with the gate of the fourth field effect transistor and the output terminal of said last shift register.

Each of said shift registers further includes: sixth, seventh, eighth, ninth, and tenth field effect transistors, and a clock inverted signal input terminal; the clock inverted signal input terminal being connected with gates of the ninth field effect transistor and tenth field effect transistor, a source and a drain of the ninth field effect transistor being connected with the source and the drain of the first field effect transistor, respectively, a source of the tenth field effect transistor being connected with a gate of the tenth field effect transistor, a drain of the tenth field effect transistor being connected with a source of the seventh field effect transistor and a drain of the eighth field effect transistor and a gate of the sixth field effect transistor, a gate of the seventh field effect transistor being connected with a drain of the seventh field effect transistor, a drain of the seventh field effect transistor being connected with the clock signal input terminal, a gate of the eighth field effect transistor being connected with the output terminal of said shift register, a source of the eighth field effect transistor being connected with the low voltage input terminal, a source and a drain of the sixth field effect transistor being connected with the low voltage input terminal and a drain of the fourth field effect transistor, respectively.

At the shift registers with odd sequence numbers, the clock signal input terminal inputs the clock signal and the clock inverted signal input terminal inputs the clock inverted signal.

At the shift registers with even sequence numbers, the clock signal input terminal inputs the clock inverted signal and the clock inverted signal input terminal inputs the clock signal.

Said shift registers are set on edge position of the array substrate.

The invention provides a gate driving device for TFT LCD, which obtains a gate driving signal voltage by directly depositing the shift registers on the substrate, thus overcoming the shortage of needing the driving chip to obtain the gate driving signal in the prior art, reducing the production cost, simplifying the process and improving the quality of picture.

The invention will be further described in detail with the specific embodiments in conjunction with the accompanying drawings.

DETAILED DESCRIPTION OF THE INVENTION

Figure 1:
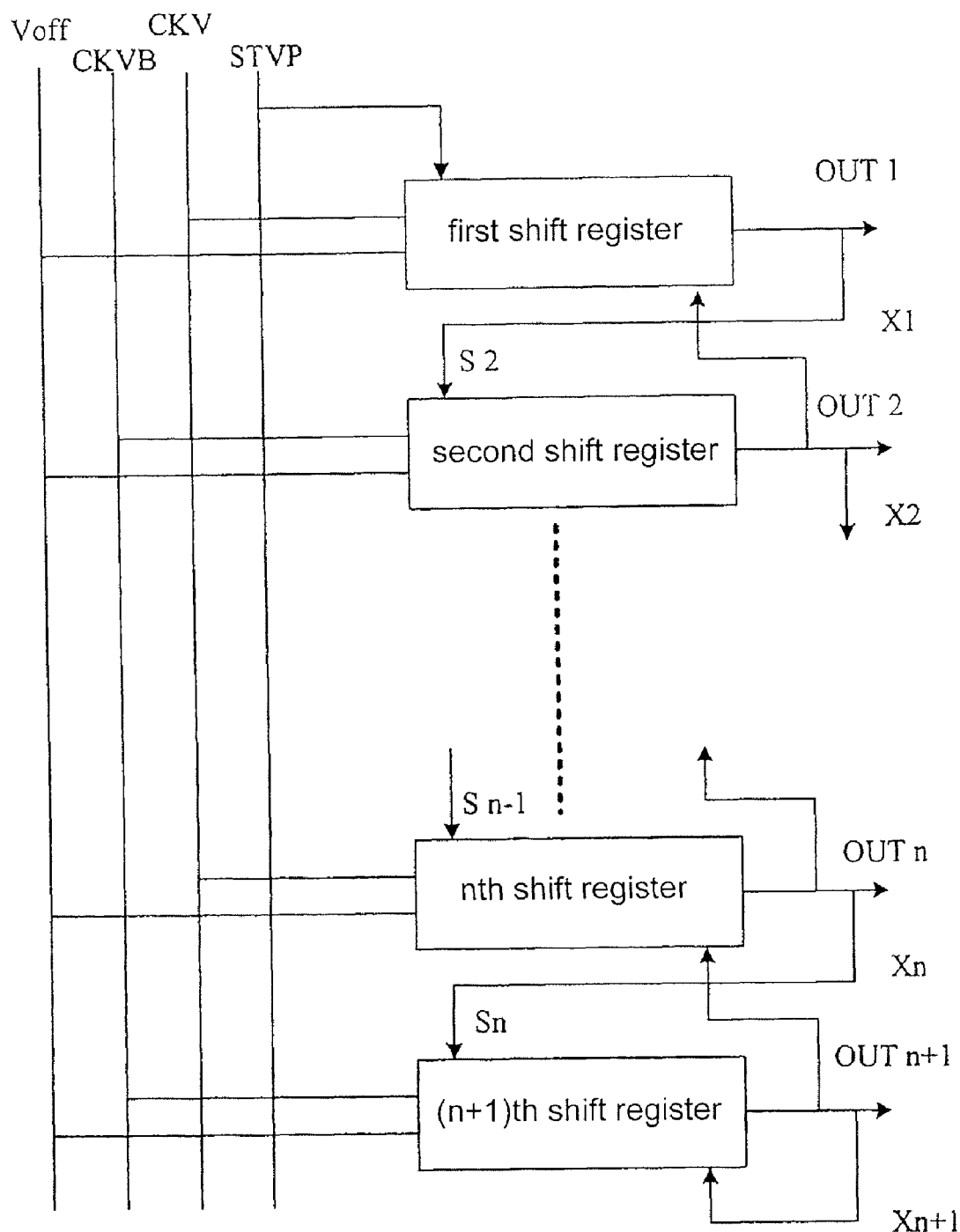
FIG. 1 is a connection block diagram of a plurality of shift registers in an embodiment of the invention.
Figure 2:
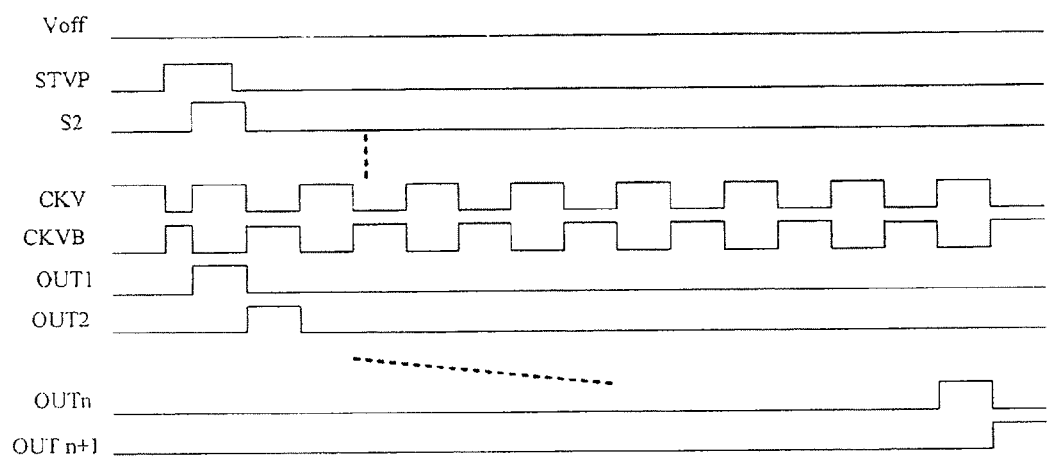
FIG. 2 is an I/O timing diagram of the invention.

FIG. 1 is a connection block diagram of a plurality of shift registers in an embodiment of the invention. FIG. 2 is an input/output timing diagram of the invention. In FIG. 2, STVP is an ON voltage timing signal. STVP is only input to the first shift register, the ON voltage timing signal of the second shift register is the output signal X1 of the first shift register (X1 and OUT1 output signal are the same), and such, the STVP signal of the (n+1)th shift register is input by the output signal Xn of the nth shift register. CKV is a clock signal. CKVB is an inverted signal of the CKV signal. The CKV signal is input to odd shift registers, that is, the first shift register, the third shift register . . . . CKVB signal is input to even shift registers, that is, the second shift register, the fourth register . . . . Voff is a low voltage of −5V~−10V. The output signals of the shift registers are OUT1, OUT2 . . . . OUTn, OUTn+1. Except for the last shift register, signal of each output terminal is fed back to a previous shift register. The feedback signal of (n+1)th (n is the sequence number of the shift register) is fed back from its own output terminal. The TFT LCD employs the progressive scanning manner in which in a same line, the gates of the TFTs connected in serial with respective liquid crystal pixels are connected together, and ON and OFF of all of the TFTs in the same line can be simultaneously controlled with the line gate driving voltage. Assuming that there are (n+1) lines of the liquid crystal pixels on the panel, (n+1) shift registers are required to output gate signal voltages. FIG. 1 shows the connection relationship between the plurality of shift registers. This embodiment achieves the purpose of removing the driving chip by obtaining the gate driving signal voltage with the shift registers directly deposited on the substrate.

Figure 3:
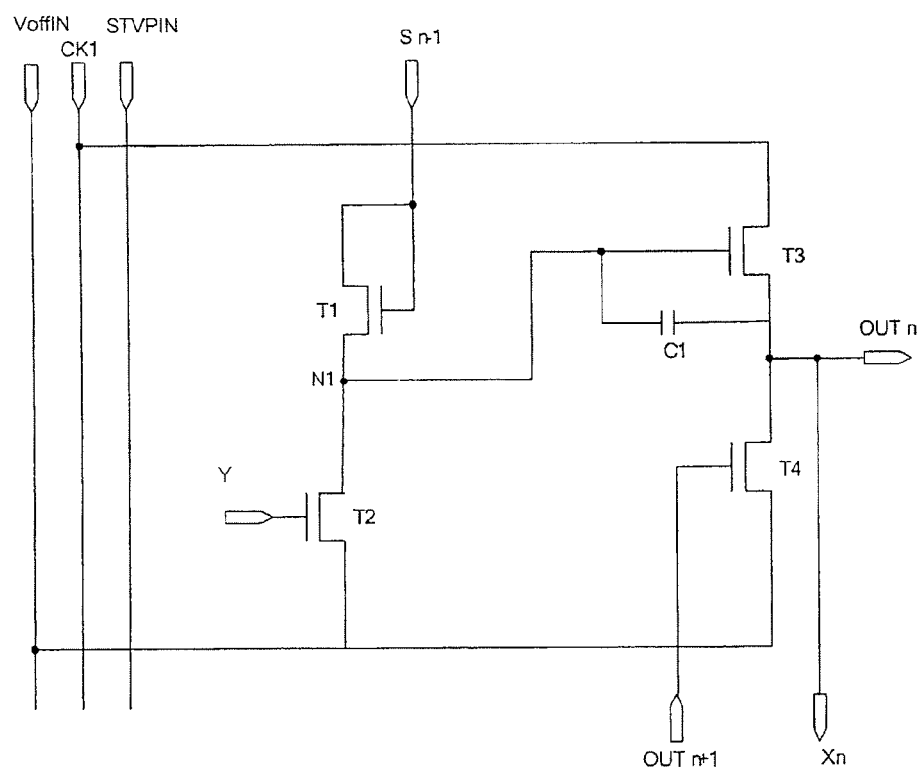
FIG. 3 is a circuit diagram of an nth shift register in an embodiment of the invention.

FIG. 3 is a circuit diagram of an nth shift register in an embodiment of the invention. The nth shift register contains three input terminals, that is, a clock signal input terminal CK1, an STVP a signal input terminal STVPIN and a Voff signal input terminal VoffIN, four field effect transistors T1, T2, T3 and T4, a capacitor C1, and two output terminals OUTn and Xn. The Sn-1 input terminal inputs the ON voltage timing signal output by the previous shift register, that is, the (n−1)th shift register. The Y output terminal outputs the signal fed back by the (n+1)th output terminal OUTn+1 of the (n+1)th shift register. The Y signal terminals of the shift registers except for the (n+1)th shift register have no input. For the shift registers with n being odd, the clock signal input terminal CK1 inputs CKV signal. For the shift registers with n being even, the clock signal input terminal CK1 inputs CKVB signal. The operation principle of the shift register will be described with reference to FIGS. 2 and 3 hereinafter. For the shift registers with n being odd, the terminal CK1 inputs CKV signal; when the Sn-1 inputs a high level, the transistors T1 and T3 are turned ON, and the output signal OUTn coincides with the CKV signal (for the even shift registers, the CKV signal input terminal CK1 inputs CKVB signal, and the output signal OUTn coincides with the CKVB signal). When the CKV signal is at a high level, OUTn and Xn output a high level, therefore obtaining the purpose of outputting the gate driving signal voltage. When the Sn-1 inputs a high level OFF, the transistor T1 is turned OFF, and the node N1 below the transistor T1 still remains the high level and the transistor T3 remains ON, because the voltage of the node N1 is not pulled down by a low level. Further, since the CKV signal remains the high level output, OUTn and Xn remain the high level output. When the CKV signal outputs a low level, OUTn and Xn output a low level. At the same time, the output signal OUTn+1 of the (n+1)th shift register outputs a high level to the nth shift register, the transistor T4 is turned ON, and the low level output by Voff is connected with the transistor T4, therefore protecting the low level output of OUTn. For the n+1 shift registers for processing a frame of image signal shown in FIG. 1, the CKV signal controls the output of the odd shift registers, and the CKVB signal controls the output of the even shift registers. When the gate driving signal voltage output by the previous shift register is a high level OFF, the TFTs of the previous line are turned OFF. The next shift register subsequently outputs the gate driving signal voltage of high level, and the TFTs of the next line are turned ON, thus realizing the progressive scanning of the LCD. When the output OUTn+1 of the last shift register outputs a high level, the signal of OUTn+1 is input to the Y signal input terminal, and the transistor T2 is turned ON. The (n+1)th shift register has a high level output, and the other shift registers remains the low level output, thus avoiding the influence on the next frame of image signal.

Figure 4:
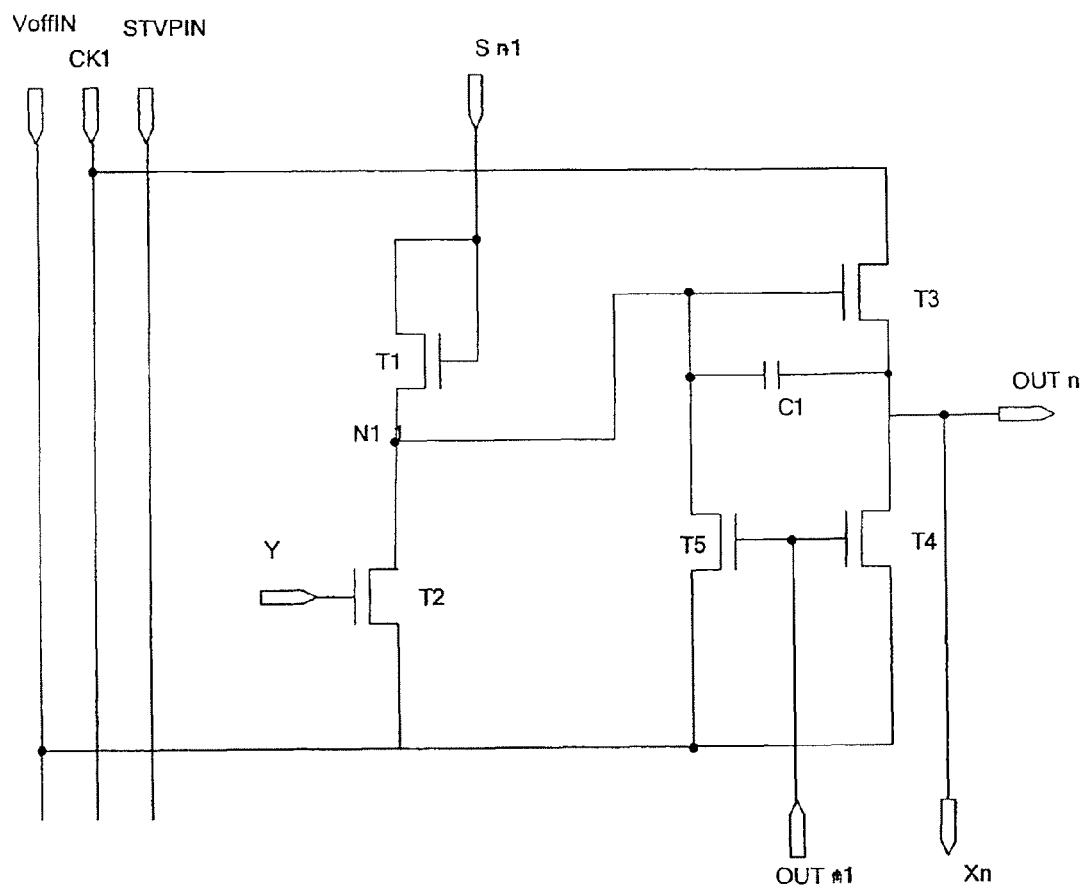
FIG. 4 is a circuit diagram of an nth shift register in another embodiment of the invention.

FIG. 4 is a circuit diagram of an nth shift register in another embodiment of the invention. As compared with the previous embodiment, this embodiment has an additional field effect transistor T5. The operation principle of the shift register will be described with reference to FIGS. 2 and 4 hereinafter. For the shift registers with n being odd, the terminal CK1 inputs the CKV signal; when the Sn-1 outputs a high level, the transistors T1 and T3 are turned ON, and the output signal OUTn coincides with the CKV signal. When the CKV signal is at a high level, OUTn and Xn output a high level, thus obtaining the purpose of outputting the gate driving signal voltage. When the Sn-1 outputs a high level OFF, the transistor T1 is turned OFF, and the node N1 below the transistor T1 remains the high level and the transistor T3 remains ON, because the voltage of the node N1 is not pulled down by a low level. Further, since the CKV signal remains the high level output, OUTn and Xn remains the high level output. When the CKV signal output a low level, OUTn and Xn output a low level. At the same time, the output signal OUTn+1 of the (n+1)th shift register outputs a high level to the nth shift register, the transistors T4 and T5 are turned ON, and the low level output by Voff is connected with the transistors T4 and T5, thus maintaining the low level output of OUTn. When the transistor T5 is turned ON, the gate of the transistor T3 keeps the low level stable, protecting the output signal from the influence by the input CKV signal, thus maintaining the low level output after the high level OFF of the output signal. For the shift registers with n being even, the clock signal input terminal CK1 inputs the CKVB signal. Except for the above, the operation principle of the even shift registers is the same as that of the odd shift registers, and the details thereof will be omitted.

Figure 5:
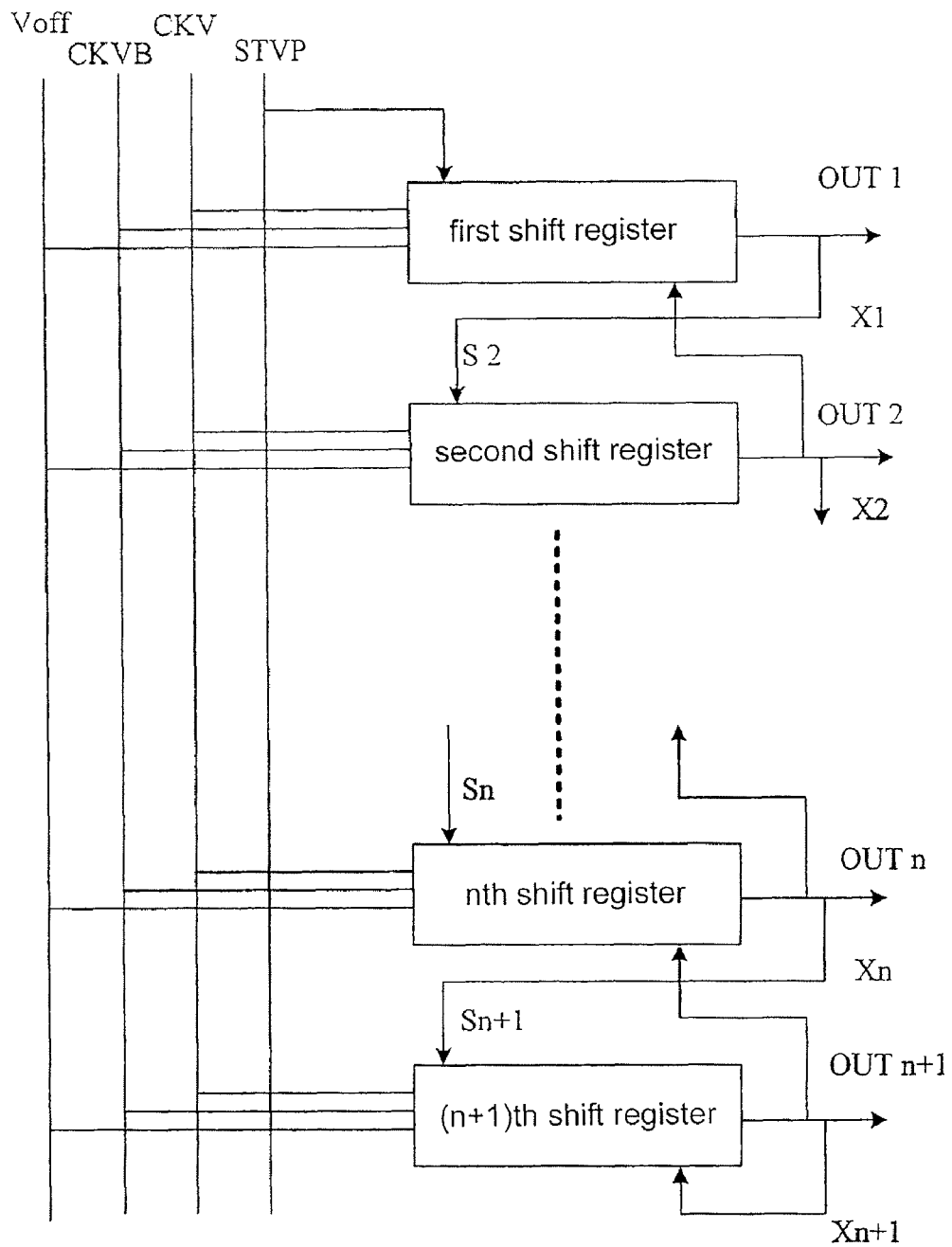
FIG. 5 is a connection block diagram of a plurality of shift registers in another embodiment of the invention.
Figure 6:
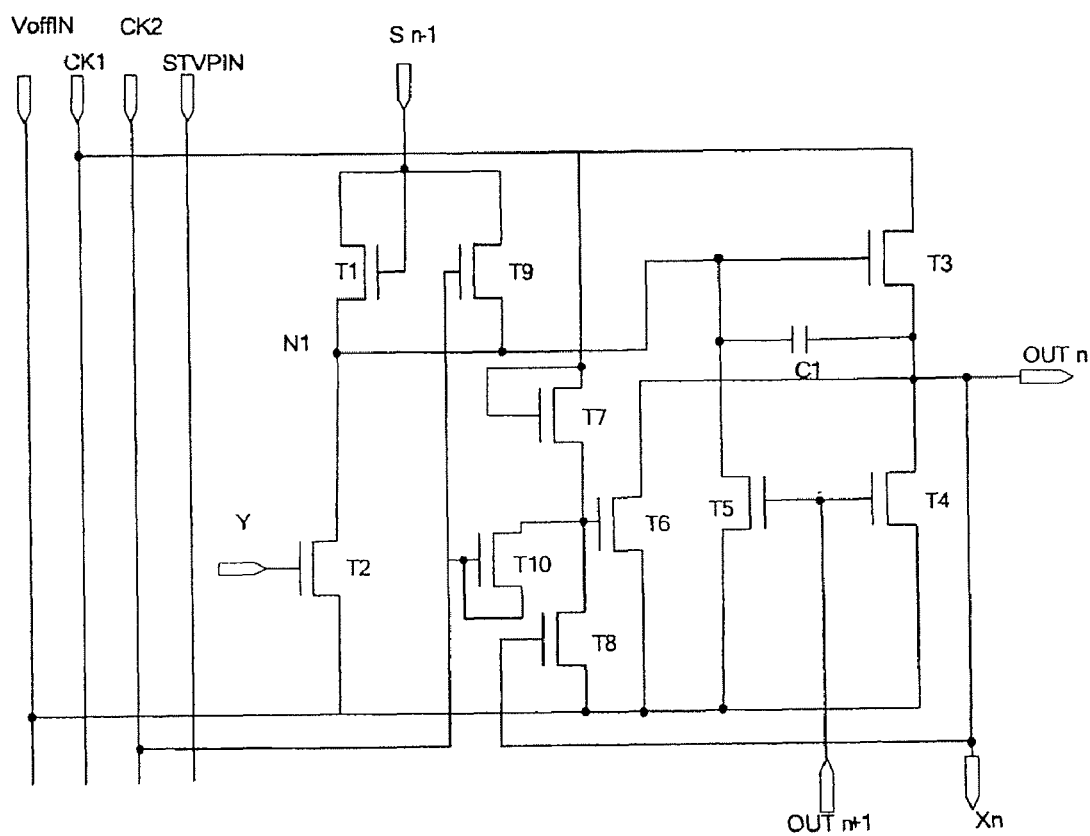
FIG. 6 is a circuit diagram of an nth shift register in yet another embodiment of the invention.

FIG. 5 is a connection block diagram of a plurality of shift registers in another embodiment of the invention. FIG. 6 is a circuit diagram of an nth shift register in another embodiment of the invention. In this embodiment, the shift register has four input terminals, that is, a clock signal input terminal CK1, an STVP signal input terminal STVPIN, a Voff signal input terminal VoffIN, and a clock inverted signal input terminal CK2. The operation principle of the shift register will be described with reference to FIGS. 5 and 6 hereinafter. For the shift registers with n being odd, the terminal CK1 inputs the CKV signal, and the terminal CK2 inputs the CKVB signal. When the Sn-1 outputs a high level, the transistors T1 and T3 are turned ON, and the output signal OUTn coincides with the CKV signal. When CKV signal is at high level, OUTn and Xn output a high level, thus achieving the purpose of outputting the gate driving signal voltage. When the Sn-1 outputs a high level OFF, transistor T1 is OFF, the node N1 below the transistor T1 remains the high level and the transistor T3 remains ON, because the voltage of the node N1 is not pulled down by a low level. Further, since the CKV signal remains the high level output, OUTn and Xn remains the high level output. When the CKV signal outputs a low level, OUTn and Xn output a low level, and the CKVB signal outputs a high level at this time. At the same time, the output signal OUTn+1 of the (n+1)th shift register outputs a high level to the nth shift register, and the transistors T4, T5, T6, T9 and T10 are turned ON. Since the CKVB signal outputs a low level at this time, after the transistor T9 is turned ON, the node N1 turns to a low level, and the low level output by Voff is connected with the transistors T4, T5, T6, so that the low level output of OUTn is maintained. Here, if the node N1 remains a high level and unstable floating state, it likely results in an unstable output signal voltage, thus affecting the quality of the picture. In this embodiment, the addition of the CKVB signal changes the voltage on the node N1 to the low level, avoiding the floating of the voltage on the N1 and ensuring the stability of the output signal voltage. Further, since the CKV signal (mainly being a high voltage) will interfere with the voltage on the node N1 and the voltage on the output terminal, the capacitor C1 can function as stabilizing the output voltage. For the n+1 shift registers for processing a frame of image signal shown in FIG. 5, when the output OUTn+1 of the last shift register outputs a high level, the signal of OUTn+1 is input to the Y signal input terminal. The transistor T2 is turned ON, the (n+1)th shift register has a high level output, and the other shift registers remains the low level output, thus avoiding the influence on the next frame of image signal. For the shift registers with n being even, there are also four input terminals with the difference in that the CKVB signal is input to the clock signal input terminal CK1, and the CKV signal is input to the clock inverted signal input terminal CK2. The operation principle thereof is the same as that of the shift registers with n being odd. As compared with the previous two embodiments, in this embodiment, the transistors T6, T7, T8, T9 and T10 are incorporated which can stabilize the output gate driving signal voltage, thus improving the quality of the picture of the LCD.

The structure of the shift register in the invention is not limited to the above embodiments. The stability of the voltage on the node N1 below the transistor T1 and the output signal voltage can be ensured by adding field effect transistors or by other means.

The shift register in the above embodiments can be realized by 5-layer mask process or 4-layer mask process, by arranging the field effect transistors on the margin part outside the active region on the substrate or at the edge of the substrate, and then directly depositing them on an array substrate. The material constructing the channel of the field effect transistors may be semiconductor such as amorphous silicon and polycrystalline silicon, etc.

The invention obtains a gate driving signal voltage by the shift registers directly deposited on the substrate without additional a driving chip, thus substantially reducing the cost for producing the LCDs. In general, an LCD of 17 inch requires designing four gate pad regions for each module, and requires four film layers and four driving chips. With the present invention producing one module, the cost of four chips can be saved, while simplifying the process.

Finally, it is noted that the above embodiments is only for explaining the technical solution of the invention, and not for limitation. Although the invention has been described in detail with reference to the preferred embodiments, those skilled in the art would appreciated that the technical solution of the invention can be modified, or part of the features thereof can be replaced, without departing from the spirit and scope of the invention.

The invention claimed is:

1. A gate driving device for Thin Film Transistor liquid crystal display, characterized in comprising: a plurality of sequentially connected shift registers, directly deposited on an array substrate; each of said shift registers including: first, second, third, and fourth field effect transistors, a capacitor, and an ON voltage timing signal input terminal, a clock signal input terminal and a low voltage input terminal; the ON voltage timing signal input terminal being connected with a drain of the first field effect transistor, a gate of the first field effect transistor being connected with a drain of the first field effect transistor, the clock signal input terminal being connected with a drain of the third field effect transistor, the capacitor being connected between a source and a gate of the third field effect transistor, a drain and a source of the fourth field effect transistor being connected with the source of the third field effect transistor and the low voltage input terminal, respectively, a source and a drain of the second field effect transistor being connected with the source of the first field effect transistor and the low voltage input terminal, respectively; a output terminal of each of said shift registers except for a first shift register and a last shift register being connected with a gate of the fourth field effect transistor of a previous shift register and the ON voltage timing signal input terminal of a next shift register; a output terminal of the last shift register being connected with a gate of the fourth field effect transistor of a previous shift register and a gate of the second field effect transistor of said last shift register, a output terminal of the first shift register being connected with the ON voltage timing signal input terminal of a next shift register; the clock signal input terminal of the shift registers with odd sequence numbers inputting a clock signal, the clock signal input terminal of the shift registers with even sequence numbers inputting a clock inverted signal.

2. The gate driving device for Thin Film Transistor liquid crystal display according to claim 1, characterized in that each of said shift registers except for the last shift register further includes: a fifth field effect transistor; a gate of said fifth field effect transistor being connected with the gate of the fourth field effect transistor and the output terminal of the next shift register, a source and a drain of said fifth field effect transistor being connected with the gate of the third field effect transistor and the low voltage input terminal, respectively, a gate of the fifth field effect transistor of the last shift register being connected with the gate of the fourth field effect transistor and the output terminal of said last shift register.

3. The gate driving device for Thin Film Transistor liquid crystal display according to claim 2, characterized in that each of said shift registers further includes: sixth, seventh, eighth, ninth, and tenth field effect transistors, and a clock inverted signal input terminal; the clock inverted signal input terminal being connected with gates of the ninth field effect transistor and tenth field effect transistor, a source and a drain of the ninth field effect transistor being connected with the source and the drain of the first field effect transistor, respectively, a source of the tenth field effect transistor being connected with a gate of the tenth field effect transistor, a drain of the tenth field effect transistor being connected with a source of the seventh field effect transistor and a drain of the eighth field effect transistor and a gate of the sixth field effect transistor, a gate of the seventh field effect transistor being connected with a drain of the seventh field effect transistor, a drain of the seventh field effect transistor being connected with the clock signal input terminal, a gate of the eighth field effect transistor being connected with the output terminal of said shift register, a source of the eighth field effect transistor being connected with the low voltage input terminal, a source and a drain of the sixth field effect transistor being connected with the low voltage input terminal and a drain of the fourth field effect transistor, respectively.

4. The gate driving device for Thin Film Transistor liquid crystal display according to claim 3, characterized in that at the shift registers with odd sequence numbers, the clock signal input terminal inputs the clock signal and the clock inverted signal input terminal inputs the clock inverted signal.

5. The gate driving device for Thin Film Transistor liquid crystal display according to claim 3, characterized in that at the shift registers with even sequence numbers, the clock signal input terminal inputs the clock inverted signal and the clock inverted signal input terminal inputs the clock signal.

6. The gate driving device for Thin Film Transistor liquid crystal display according to any one of claims 1 to 5, characterized in that said shift registers are set on edge position of the array substrate.

* * * * *